United States Patent
Derby

(12) 
(10) Patent No.: US 6,519,737 B1
(45) Date of Patent: Feb. 11, 2003

(54) COMPUTING THE CRC BITS AT A TIME FOR DATA WHOSE LENGTH IN BITS IS NOT A MULTIPLE OF M

(75) Inventor: Jeffrey Haskell Derby, Chapel Hill, NC (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/520,048

(22) Filed: Mar. 7, 2000

(51) Int. Cl.[7] .............................................. H03M 13/09
(52) U.S. Cl. ..................... 714/781; 714/757; 714/807
(58) Field of Search ................................. 714/807, 781, 714/757

(56) References Cited

U.S. PATENT DOCUMENTS

| | | | |
|---|---|---|---|
| 3,601,800 A | 8/1971 | Lee .............................. | 714/757 |
| 3,622,985 A | 11/1971 | Ayling et al. ................ | 714/757 |
| 5,113,401 A | 5/1992 | Chevillat et al. ............ | 714/758 |
| 5,361,266 A | 11/1994 | Kodama et al. ............. | 714/758 |
| 5,619,516 A | 4/1997 | Li et al. ....................... | 714/807 |
| 5,671,238 A | * 9/1997 | Chen et al. ................... | 714/757 |
| 5,734,826 A | 3/1998 | Olnowich et al. ........... | 709/238 |
| 5,878,057 A | 3/1999 | Maa ............................. | 714/757 |

FOREIGN PATENT DOCUMENTS

JP        09018355        1/1997 .......... H03M/13/00

OTHER PUBLICATIONS

Guido Albertengo et al., "Parallel CRC Generation", IEEE Oct. 1990 pp. 63–71.

* cited by examiner

Primary Examiner—Stephen M. Baker
(74) Attorney, Agent, or Firm—Scott W. Reid

(57) ABSTRACT

A method, and a system for performing the method, for computing cyclic redundancy code (CRC) for use in a communication data stream M bits at a time for an input sequence u(n) whose length is not a multiple of M. The method includes (i) representing a frame of data to be protected as the input sequence; (ii) determining a cyclic redundancy code (CRC) for the input sequence M bits at a time from a state vector, until a last block of the input sequence is reached; (iii) if the last block of the input sequence is full, then determining the CRC to be a completed CRC; and (iv) if the last block of the input sequence is not full, then performing three functions. The method can further include (v) appending the completed CRC as a frame check sequence (FCS) to the communication data stream for detection by a receiving device. The three functions are (a) setting a number of the last bits of the last block equal to zero; (b) processing the last block, padded with the number of last bits equal to zero, according to steps (i) and (ii) to determine a new CRC ($y_{CRC}$); and (c) running the state vector backwards in time to determine a completed CRC.

19 Claims, 5 Drawing Sheets

FIG. 6A $$T = \begin{bmatrix}
1011000101110110000110100001010 \\
0111011000011010000101000101110 \\
0001101000010100001011100101111 \\
0001010000101110010111111100001 \\
0010111001011111110000101101110 \\
0101111111100001011011001011111 \\
0101000000011000010001011010100 \\
0001100001000101101010001101100 \\
0100010110101000110110010101010 \\
0001100110101111010011100100000 \\
0001111000111000010110100100001 \\
0011100001011010010000110001101 \\
0101110100100001100011011001010 \\
0100001100011011001010111100011 \\
0001101100101011100011100101111 \\
0010101111000111001011110100001 \\
0111011001011001010110010010001 \\
0101100101011001001000101010100 \\
0101100100100010101010010000010 \\
0010000101010001000010011100111 \\
0001100111110010111111010101000 \\
0101001110001011010111011001000 \\
0011101000010101110001011101011 \\
0010101110001011101011000011001 \\
0011101011111101000101001111111 \\
0110101101011111110010010111001 \\
0101111111100010011100100110010 \\
1110101011100111001010001100100 \\
0111111001011101101111101010111 \\
0101111011011110101011101101110 \\
0110111110110001100111001101100 \\
0110100110110001011101100001101
\end{bmatrix}$$

FIG. 6B $$T^{-1} = \begin{bmatrix}
1010010\ 100100000001101010111000 \\
011011000010010000100010001100 \\
010001101101101000001001101110 \\
001110010010111011010000011101 \\
000111101110000001000(111001000111 \\
011100111110100100010110101101 \\
0011111111110110111100111000110 \\
0111111101000011000111011000000 \\
000100111110000010101000011111 \\
010000110011111001110111001000 \\
010011110110001011100111110011 \\
001010111111110101100010011100 \\
000000111101010000001111111011 \\
010010010010000010001100001110 \\
011000001010000101010111010001 \\
010111001101111011011101010101 \\
010111101111111101001011101110 \\
011001010011000100011100000000 \\
000100001010000000011000000001 \\
001100001011101111000000101100 \\
010011000110001111010111101110 \\
000111001001001100001111101000 \\
\ 011111010110110010001010110101 \\
011010000000110001110001101001 \\
010111100001011100010010001011 \\
001110100100100011111111100111 \\
000101010111111000101011100010 \\
011011010110101001110110010111 \\
001001011110010111111010000000 \\
010001110110100100001011111010 \\
000110011100011100001000100101 \\
010111101100101011110100100111
\end{bmatrix}$$

COMPUTING THE CRC BITS AT A TIME FOR DATA WHOSE LENGTH IN BITS IS NOT A MULTIPLE OF M

REFERENCES

The following references, which are incorporated herein by reference in their entirety, are referenced in the remainder of this patent document:

[1] ISO 3309, Information processing systems—Data communication—High-level data link control procedures—Frame structure, 1984.
[2] W. W. Peterson and D. T. Brown, "Cyclic codes for error detection," Proc. IRE, vol. 49, pp. 228–235, January 1961.
[3] R. E. Blahut, Theory and Practice of Error Control Codes. Reading, MA: Addison-Wesley, 1983.
[4] IBM Corporation, Synchronous Data Link Control-Concepts, GA27-3093-3, June 1986.
[5] A. M. Patel, "A multi-channel CRC register," in AFIPS Conference Proceedings, vol. 38, pp. 11–14, Spring 1971.
[6] A. Perez, "Byte-wise CRC calculations," IEEE Micro, vol. 3, pp. 40–50, June 1983.
[7] G. Albertengo and R. Sisto, "Parallel CRC generation," IEEE Micro, vol. 10, pp. 63–71, October 1990.
[8] T-B. Pei and C. Zukowski, "High-speed parallel CRC circuits in VLSI," IEEE Trans. Commun., vol. 40, pp. 653–657, April 1992.
[9] R. J. Glaise and X. Jacquart, "Fast CRC calculation," in Proc. 1993 IEEE Intl. Conf. on Computer Design: VLSI in Computers and Processors, Cambridge, Mass., pp. 602–605, October 1993.
[10] S. L. Ng and B. Dewar, "Parallel realization of the ATM cell header CRC," Computer Commun., vol. 19, pp. 257–263, March 1996.
[11] M. Braun et.al., "Parallel CRC computation in FPGAs," in Proc. 6th Intl. Workshop on Field Programmable Logic and Applications, Darmstadt, Germany, pp. 156–165, September 1996.
[12] S. Li and J. A. Pasco-Anderson, Efficient CRC remainder coefficient generation and checking device and method, U.S. Pat. No. 5,619,516, Apr. 8, 1997.
[13] R. J. Glaise, "A two-step computation of cyclic redundancy code CRC-32 for ATM networks," IBM J. Res. Devel., vol. 41, pp. 705–709, November 1997.
[14] ITU-T Rec. 1.432, B-ISDN User-Network Interface—Physical Layer Specifications, pp. 16–20, March 1993.
[15] J. J. D'Azzo and C. H. Houpis, Linear Control System Analysis and Design. New York: McGraw-Hill, 1981.
[16] K. Hoffman and R. Kunze, Linear Algebra. Englewood Cliffs, N.J.: Prentice Hall, 1971.

The following related patent document of common assignee and inventorship is incorporated herein by reference in its entirety:

U.S. Patent Application entitled "Method and Apparatus for High-Speed CRC Computation Based on State-Variable Transformation," filed Mar. 7, 2000 Ser. No. 09/520,261.

BACKGROUND OF THE INVENTION

1. Field of the Invention

The following invention relates generally to error detection in a telecommunications environment and specifically to speeding up cyclic redundancy code (CRC) calculations to speed up error detection.

2. Related Art

The use of a cyclic redundancy check, or CRC, is a standard means for error detection in communication networks. A block, or frame, of binary data to be protected is represented as a polynomial over GF(2), the field of integers modulo 2. Computation of the CRC is defined in terms of division of this polynomial by a so-called generator polynomial, with the division carried out using arithmetic in GF(2). The CRC is appended to the data frame before transmission as a frame-check sequence (or FCS), and is checked at the receiving end using an essentially identical polynomial division process.

A formal definition of the CRC employed in data communication applications is given in a number of communication standards. The ISO definition, taken from [1], is paraphrased here:

The K-bit frame-check sequence shall be the ones complement of the sum (modulo 2) of: (a) the remainder of $z^N U_0(z)$ divided (modulo 2) by the generator polynomial $G(z)$, where the number of bits in the input sequence to be protected by the CRC is N, and $U_0(z)$ is an initialization polynomial of degree less than K; and (b) the remainder of $z^k U_p(z)$ divided (modulo 2) by the generator polynomial $G(z)$, where $U_p(z)$ is the polynomial representing the input sequence to be protected by the CRC.

For purposes of this disclosure, the term "CRC" will be used to refer to the sum of the two remainders referred to in the definition above. The FCS that is appended to the data frame is equal to the ones complement of what we are calling the CRC. Note that in GF(2) finding the ones complement of a number is equivalent to adding 1 to the number.

If we think of the input sequence as a time series $u(n)$ taking on values 0 or 1 and with time index n starting from 0 (so that $u(0)$ is the first bit to be processed), the polynomial representation referred to in the CRC definition is $$U_p(z) = \sum_{n=0}^{N-1} u(n) z^{N-1-n} \tag{1}$$

The generator polynomial $G(z)$ is a polynomial of degree K. The ISO standard generator polynomials for K=16 and K=32 are $$G_{16}(z) = z^{16} + z^{12} + z^5 + 1$$

$$G_{32}(z) = z^{32} + z^{26} + z^{23} + z^{22} + z^{16} + z^{12} + z^{11} + z^{10} + z^8 + z^7 + z^5 + z^4 + z^2 + z^1 \tag{2}$$

The initialization polynomial is generally either zero or the polynomial of degree K−1 all of whose coefficients are 1.

The error detection properties of the CRC depend on the characteristics of polynomials over the field GF(2), are well known (see [2], for example), and are not at issue in this disclosure. Rather, we address here efficient means for high-speed CRC computation.

The usual reference implementation for computing the CRC is derived from a circuit for polynomial division that employs a shift register with feedback (see, for example, Sec. 6.2 in Ref [3]). One form of this reference implementation, generalized from Ref. [4], is shown in FIG. 1. The blocks labeled $z^{-1}$ are unit delay elements that make up the shift register; for the block whose output is $x_k(n)$, for example, the input is equal to $x_k(n+1)$. The scale factors of the gain elements are the coefficients of the divisor polynomial $G(z)$; i.e.

$$G(z) = \sum_{k=0}^{K} g_k z^k \quad (3)$$

where we assume the coefficients are normalized with $g_k=1$. The input sequence u(n) contains the finite-length block of data to be protected, for n=0, 1, ... N−1. After the last element of the input sequence has been processed, i.e. at n=N, the shift register contains the remainder of the division required by the CRC definition. More precisely:

Let the shift register be initialized so that it contains a representation of the initialization polynomial $U_0(z)$; i.e. if $$U_o(z) = \sum_{k=0}^{K-1} u_{ok} z^k \quad (4)$$

then set $x_k(0)=U_{ok}$ for k=0, 1, ..., K−1. Then, at n=N, the contents of the shift register represents the sum of the remainder of $z^N U_o(z)$ divided by G(z), and the remainder of $z^K U_p(z)$ divided by G(z), where $U_p(z)$ is the polynomial representation of the input data sequence according to Eqn. (1). In other words, if we call the sum of these two remainders $R_T(z)$, with $$R_T(z) = \sum_{k=0}^{K-1} r_{Tk} z^k \quad (5)$$

then the coefficients of this polynomial, which make up the CRC, satisfy:

$$r_{Tk} = x_k(N); \; k0, 1, \ldots, K-1 \quad (6)$$

Note that when the CRC is computed over GF(2) as in the standard definition, the appropriate arithmetic is employed, Thus the summing blocks in FIG. 1 implement modulo 2 addition, and the negative signs in the figure are irrelevant (because any element in GF(2) is its own additive inverse). In addition, since the coefficients of G(z) are all either 0 or 1, the gain elements shown in the figure would be implemented either as a closed connection (for a 1) or an open circuit (for a 0).

The processing of the input sequence in FIG. 1 can be described by the difference equation:

$$x(n+1) = Ax(n) + bu(n) \quad (7)$$

where the K-dimensional state vector x(n) is $$x(n) = [x_0(n) x_1(n) \ldots x_{k-1}(n)]^T \quad (8)$$

A is a K×K matrix with the form $$A = \begin{bmatrix} 0 & 0 & \ldots & 0 & 0 & -g_0 \\ 1 & 0 & \ldots & 0 & 0 & -g_1 \\ 0 & 1 & \ldots & 0 & 0 & -g_2 \\ \ldots & \ldots & \ldots & \ldots & \ldots & \ldots \\ 0 & 0 & \ldots & 1 & 0 & -g_{k-2} \\ 0 & 0 & 0 & 0 & 1 & -g_{k-1} \end{bmatrix} \quad (9)$$

and b is the K×1 matrix $$b = [(-g_0)(-g_1) \ldots (-g_{k-1})]^T \quad (10)$$

where the superscript 'T' indicates transpose. The initial condition for the difference equation (7) is determined by the initialization polynomial; with $U_0(z)$ as in Eqn. (4):

$$x_k(0) = u_{ok}; \; k=0, 1, \ldots, K-1 \quad (11)$$

Again, when the CRC is computed over GF(2), the calculation in Eqn. (7) is done using modulo-2 arithmetic, and the negative signs in the A matrix in Eqn. (9) and the b matrix in equation (10) are superfluous. Note also that the shift register contains the CRC. In other words, the state vector of the system described by the state equation (7) is equal to the CRC after the last input element has been processed, at n=N.

Observe that Eqn.(7) is executed once for each element of the input sequence u(n) (i.e. for each bit of the input bitstream). A variety of techniques have been developed to compute the CRC more efficiently by processing some number of bits (i.e. elements of the input sequence u(n)) in parallel. This increased efficiency has been found useful for CRC computation in both hardware and software. Parallel CRC computation was originally described by Patel [5]. Perez [6] has an early example of its implementation in software. References [7] through [13] provide other examples of hardware implementations of parallel CRC computation. A companion disclosure document, the U.S. Patent Application entitled "Method and Apparatus for High-Speed CRC Computation Based on State-Variable Transformation" (listed under the references section above, incorporated herein by reference in its entirety, and referenced hereinafter as "companion patent document"), describes a maximally efficient (in the sense of throughput relative to circuit speed) hardware implementation.

The basis of all reported techniques for parallel CRC computation can be established by describing formally the block-oriented version of the system state equation (7). Let the elements of the input sequence u(n) be grouped into blocks of length M, so that the input to the block-oriented system is now a vector $u_M(m)$ with $$u_M(m) = [u(mM+M-1)u(mM+M-2) \ldots u(mM+1)u(mM)]^T; \; m=0, 1 \ldots (N/M)-1 \quad (12)$$

assuming that N is an integral multiple of M. It is well known that the state equation (7) can be rewritten as:

$$x(m+1) = A^M x(m) + B_M u_M(m) \quad (13)$$

where the index m is incremented by one for each block of M input elements. The K×K matrix $A^M$ in Eqn. (13) is equal to the A matrix in Eqn. (9) multiplied by itself M times. The matrix $B_M$ is a K×M matrix whose columns are found by multiplying the vector b in Eqn. (7) by successively higher powers of A; for M≦K, the columns of $B_M$ are the M rightmost columns of $A^M$. The initial condition for the difference equation (13) is given by Eqn. (11); it is identical to that for the original difference equation. Additionally, the state vector contains the CRC after the last block of M input elements has been processed, assuming that N is an integral multiple of M.

All of the referenced techniques work directly with the block-oriented state equation (13) or else work with some modified or transformed version of this equation. In other words, they all process blocks consisting of M input elements, i.e. groups of M bits from the input data sequence. Thus, there is an implicit (or possibly explicit) assumption in all these techniques that N, the number of bits in the input data sequence, is an integral multiple of M.

At the same time, for most if not all of the referenced techniques, the efficiency increases with M. For example, it clear from the results published by Pei and Zukofsky in [8] that, at least for their hardware-based technique, the increase in throughput for a given circuit clock speed increases approximately linearly with M. Similarly, for the hardware-based technique described in the companion patent document, the throughput is in fact M times that for bit-at-a-time CRC computation at the same circuit clock speed.

In most practical data-communication systems the length N of the data sequences for which CRCs are computed is an integral multiple of 8 bits, so that M=8 is a common value for block CRC computation. Since N is in general not guaranteed to be an integral multiple of any larger number (16, for example), use of a value of M larger than 8 requires some postprocessing to complete the computation of the CRC. This postprocessing is required for all known techniques as well as for the technique described in companion patent document. While several references have presented results for M>8 (see [8], for example), not one has discussed the postprocessing required for these cases.

Indeed, it appears that there is no explicitly described known method for computing the CRC M bits at a time when M is not an integral multiple of N. However, one can develop a set of postprocessing steps as a straightforward extension of almost any of the referenced known techniques for parallel CRC computation. Consider an example with M32 and N an integral multiple of 8. For some known technique, say that in [8], construct an implementation with M=8 in addition to the one with M=32. Process all of the 32-bit blocks of input elements, except the last block, through the implementation with M=32. Clearly, the last block of input elements to be processed will contain either 8, 16, 24, or 32 bits. If the last 32-bit block is complete, process it through the implementation with M=32. Otherwise, process the last block through the implementation with M=8 as either one, two, or three 8-bit blocks. This handling of the last input block represents the desired postprocessing.

That the postprocessing described requires essentially two separate implementations of a parallel CRC computation, e.g. two sets of circuitry, is not necessarily a drawback. It may be that the increased throughput achieved by using M=32 for all but the last block of input elements rather than M=8 for the entire input data sequence justifies the more complex solution. When maximum throughput is the fundamental objective, however, this known postprocessing suffers from a significant disadvantage, namely that it requires some non-zero processing time after the end of an input data frame before processing of the next input data frame can begin. In other words, it requires some interframe idle time on the communication link from which the data is being received or to which the data is being transmitted. To see this, consider a hardware design optimized for maximum throughput using the technique described in the companion patent document. The technique in the companion patent document is maximally efficient because the time it requires to process M bits taken M bits at a time is independent of M. Assuming an optimized design, the time to process 32 bits with M=32 will be approximately equal to 32 bit-times, while the time to process 8 bits with M8 will also be approximately equal to 32 bit-times. In other words, execution of the postprocessing method described above could extend up to 64 bit-times beyond the end of the data frame being processed. Whether or not this represents a problem depends on the characteristics of the communication interface, in particular on the minimum number of bit-times between the ends of two successive data frames. (There is another factor here, namely the minimum number of bit-times between the end of one data frame and the beginning of the next data frame. We make the assumption here that the first bit of any data frame is aligned at one end of the M-bit block, i.e., at the right-hand end, using the notation of Eqn. (12). For additional comments on this assumption and the reason for making it, see the discussions below.) LAN frame formatting is such that there are always more than 128 bit-times between the end of one frame and the end of the next. With HDLC frame formatting, however, there can be as few as 40 bits between the end of one frame and the end of the next. (The numbers here include the bit-times needed for transmission or reception of the CRC field itself.)

What is required is a novel postprocessing technique that is easily pipelined in such a way that it can operate in parallel with CRC computation for the next frame to be processed as well as with the postprocessing of the next frame if it happens to be extremely short. Essentially, it should be able to operate with zero interframe idle time even for minimal length HDLC frames. When combined with the technique for parallel CRC computation disclosed in the companion patent document, this technique would allow a maximally efficient solution for computing the CRC M bits at a time for data frames whose length is not an integral multiple of M bits.

SUMMARY OF THE INVENTION

The present invention is directed to a method, and a system for computing cyclic redundancy code (CRC) for use in a communication data stream M bits at a time for an input sequence u(n) whose length is not a multiple of M. The method includes (i) representing a frame of data to be protected as the input sequence; (ii) determining a cyclic redundancy code (CRC) for the input sequence M bits at a time from a state vector, until a last block of the input sequence is reached; (iii) if the last block of the input sequence is full, then determining the CRC to be a completed CRC; and (iv) if the last block of the input sequence is not full, then performing three functions. The method can further include appending the completed CRC as a frame check sequence (FCS) to the communication data stream for detection by a receiving device. The three functions are (a) setting a number of the last bits of the last block equal to zero; (b) processing the last block, padded with the number of last bits equal to zero, according to steps (i) and (ii) to determine a new CRC ($y_{CRC}$); and (c) running the state vector backwards in time to determine a completed CRC.

The input sequence u(n) can be defined in the field of integers modulo 2 (GF(2)). Step (i) can further include grouping the elements of the input sequence into blocks of length M; and representing the input sequences in a block oriented fashion as $u_m(m_{max})=[u(mM+M-1)\ u(mM+M-2)\ \ldots\ u(mM+1)\ u(MM)]^T$, where m=0, 1, ..., $m_{max}$, where $m_{max}$ equals (N/M)−1.

The state vector can be represented by $x(m+1)=A^M x(m) + B_M u_M(m)$, where m is an integer, where A is a K×K matrix containing the coefficients of a CRC generator polynomial, where x(m) is a K dimensional state vector defined as $[x_0(m)\ x_1(m)\ \ldots\ x_{k-1}(m)]^T$, where $B_M$ is a K×M matrix whose columns are determined by multiplying b by successively higher powers of A, and where b is a K dimensional vector containing one or more coefficients of a CRC generator polynomial.

The last block can be represented as $u_M(m_{max})$, where whether the input sequence is full is found by determining whether N/M is an integer and r2=0, where N is the length of the input sequence, where R is the greatest common divisor of M, and where the last (r2)(R) bits of the last block $u_M(m_{max})$ are zeros.

Step (iv)(a) can include setting (r2)(R) bits of the last block equal to zero. The new CRC ($y_{CRC}$) can contain the CRC of the input data sequence augmented with r2R zeros at its end, where R is the greatest common divisor of M, and where r2 is defined by the fact that the last (r2)(R) bits of the last block are zeros.

Finally, step (iv)(c) can include comprises executing $x'(r-1)=A^{-R} x'(r)$ for $r_2$ iterations, until $x'(r-1)=x'(N/R)$, which equals the completed CRC, where R is the greatest common divisor of M, and where r2 is defined by the fact that the last (r2)(R) bits of the last block are zeros, where r is initially defined as $(r_2+(N/R))$, and where $x'(r_2+(N/R))$ equals the new CRC ($y_{CRC}$).

BRIEF DESCRIPTION OF THE FIGURES

The present invention will be described with reference to the accompanying drawings, wherein:

FIGS. 6A and 6B illustrate a transform matrix T and its inverse matrix $T^{-1}$, respectively, used to compute the CRC bits M bits at a time for data whose length in bits is not a multiple of M.

In the figures, like reference numbers generally indicate identical, functionally similar, and/or structurally similar elements. The figure in which an element first appears is indicated by the leftmost digit(s) in the reference number.

DETAILED DESCRIPTION OF THE PREFERRED EMBODIMENTS

I. Summary of the Present Invention

Figures 1, 2A, 2B:
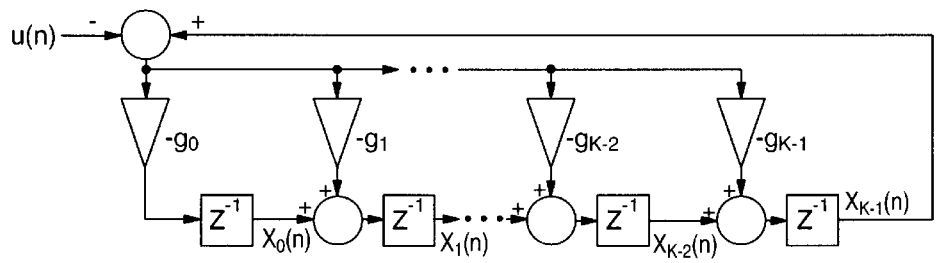
FIG. 1 illustrates a reference implementation for computing a cyclic redundancy code (CRC)
FIGS. 2A and 2B illustrate matrix A having gain coefficients for a CRC circuit as its rightmost elements, and $A^{-R}$, which is $A^{-1}$ raised to the exponent R, for an example of the standard 32-bit-CRC and with R=8.

In the following description of the preferred embodiments, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Reference implementations of CRC calculation are based on a shift register with feedback that processes the input data one bit at a time. Implementations in both hardware and software have been described that achieve greater efficiency by processing M bits of the input data at a time in parallel. For a given circuit or processor speed, the throughput of these parallel CRC implementations increases with M. However, because the number of bits in the data sequences to be protected is almost always a multiple of 8, practical implementations of parallel CRC computation have employed M=8. While several references have presented throughput results for M>8, none have described how the last, partially filled group of M bits should be handled.

This disclosure describes a postprocessing technique that permits computation of the CRC M bits at a time when the length of the data sequence is not an integral multiple of M bits. The technique employs knowledge of the length of the input data sequence but needs no knowledge of the input data itself. Both hardware and software implementations are possible. The technique can be employed with any known method for parallel CRC computation. We show an application of the technique with a maximally efficient method for parallel CRC computation that is described in the companion patent document.

II. An Overview of the Solution Provided by the Present Invention

The postprocessing technique disclosed here is based on the fact that the state equations employed to compute the CRC, either one bit at a time (Eqn. (7)) or M bits at a time (Eqn. (13)), can be run backwards in time to remove the contribution to the CRC of one or more bits at the end of the input data sequence. Consider for simplicity the bit-at-a-time state equation (7). For an input sequence u(n) of length N (i.e. for n=0, ..., N-1), the CRC is equal to x(N). Given x(N) and u(N-1), the last bit of the input sequence, we can find x(N-1) as $$x(N-1)=A^{-1}x(N)-A^{-1}bu(N-1) \qquad (14)$$

By definition, x(N-1) is the CRC of the sequence consisting of the first N-1 bits of u(n). Note also that if u(N-1) is known to be zero then this time-reversed equation is simplified.

The postprocessing method disclosed here is derived by applying this time reversal to the block state equations (13). Let R be the greatest common divisor of M and all of the possible values of N, where N is the number of bits in an input data sequence. Note that for most applications N will vary from one data frame to the next but will generally be an integral multiple of some number. This number, which is the greatest common divisor of all the possible values of N for the particular communication interface, generally also divides M and so is identified as R. Most often, we have R=8. The input data sequence u(n) will be organized into vectors (i.e., blocks) $u_M(m)$ each of length M, as specified in Eqn. (12). Given that N is not assumed to be an integral multiple of M, we consider $u_M(m)$ for m=0, 1, ..., $m_{max}$, where $m_{max}$=ceil((N/M)-1) and ceil(x) is the smallest integer greater than or equal to x. The last block, with m=$m_{max}$, may be completely filled or partially filled, depending on whether the value of N for the particular data frame represented by u(n) is or is not an integral multiple of M. In general, the first $r_1R$ bits of the last block contain the last $r_1R$ bits of u(n), while the last $r_2R$ bits of the last block contain no data (and clearly $(r_1+r_2)R=M$). Assume that the last $r_2R$ bits of $U^M(m_{max})$ are set to zero. Then $x(m_{max}+1)$ contains the CRC of the data sequence u'(n), of length $N+r_2R$, equal to u(n) followed by $r_2R$ zeros.

By construction $N+r_2R$ is an integral multiple of both M and R. Clearly, the CRC of augmented sequence u'(n) could have been found by processing R bits at a time instead of M bits at a time. Let x'(r) be the state vector in the block state equations (13) modified to process R bits at a time; i.e.

$$x'(r+1)=A^R x'(r)+B_R u_R(r) \qquad (15)$$

The R×1 matrix $u_R(r)$ here represents the augmented input sequence taken R bits at a time; its structure is evident from Eqn. (12). Using Eqn. (15), $x'(r_2+(N/R))$ is the CRC of $u'(n)$. Clearly, then $$x'(r_2+(N/R))=x(m_{max}+1) \quad (16)$$

In addition, $x'(N/R)$ is the CRC of the actual input data sequence $u(n)$. Following the reasoning that led to Eqn. (14) and using the result in Eqn. (16), we find that $x'(N/R)$ can be computed by starting from $x(m_{max}+1)$ and running Eqn. (15) backwards for $r_2$ time steps. Since the last $r_2$ vectors $U_R(r)$ are identically zero by construction, the necessary equation is easily written, namely $$x'(N/R)=(A^{-R})^{r_2}x'(r_2+(N/R))=(A^{-R})^{r_2}x(m_{max}+1) \quad (17)$$

This equation is the basis of the postprocessing method, for which a step-by-step description is now provided. A description of a preferred implementation will follow.

III. A Method for the Present Invention

Consider some technique for computing the CRC M bits at a time. For an input data sequence $u(n)$ with N an integral multiple of M, the technique will produce a vector, say $y_{CRC}$, that contains the CRC of $u(n)$. As noted above, most of the referenced known techniques employ the block state equations (13) directly; for these cases, $y_{CRC}$ will be the state vector $x(m)$, nominally at $m=m_{max}+1$. For the technique described in the companion patent document, $y_{CRC}$ will be the result of a linear transformation of the state vector associated with a modified version of the block state equations (13), again nominally at $m=m_{max}+1$.

In fact, as far as the method disclosed here is concerned, the details of how $y_{CRC}$ is obtained are not important. The CRC computation proceeds M bits at a time following some known technique until the last block of M bits is reached. Then:

If the last block is full, i.e. N./M is an integer and $r_2=0$, then it is processed directly and the computation of $y_{CRC}$ is completed. The CRC of $u(n)$ is equal to $y_{CRC}$.

If the last block $u_M(m_{max})$ is not full, i.e. $r_2>0$, then:

(1) Set the last $r_2R$ bits of the last block equal to zero.

(2) Process the last block, padded with zeros, to complete the computation of $y_{CRC}$. This vector contains the CRC of the input data sequence augmented with $r_2R$ zeros at its end.

(3) Run Eqn. (15) "backwards in time" for $r_2$ time steps. In other words, execute $$x'(r-1)=A^{-R}x'(r) \quad (18)$$

for $r_2$ iterations, with initial condition at $r=r_2+(N/R)$ with $x'(r_2+(N/R))=y_{CRC}$. The result, which is $x'(N/R)$, is the CRC of $u(n)$.

Three comments are in order at this point. First, it should be obvious that Eqn. (18) does not require an implementation that physically runs backward in time. The index r in Eqn. (18) is virtual. The real time required for execution of this equation depends on the implementation. Indeed, it is a key feature of this method that the time constraints on the execution of this equation are relaxed, as described below. Second, while we have specified in the method the execution of Eqn. (18) for $r_2$ time steps, we could have just as easily specified the execution of Eqn. (17) with $r_2$ as a parameter. Either solution is acceptable, with the choice determined by implementation considerations. What we have specified seems simpler for hardware implementations, since $r_2$ will vary in general from data frame to data frame. Finally, note that $A^{-R}$ can be found by first finding the adjoint matrix of $A^R$ using "ordinary arithmetic" over the real numbers, perhaps using standard numerical methods on a computer; the inverse of $A^R$ over GF(2) is then found by evaluating the elements of the adjoint matrix modulo 2. Similarly, the matrix multiplication in Eqn. (18) is carried out over GF(2), using modulo 2 arithmetic.

Before proceeding to describe implementations of this method, consider as an example the 32-bit CRC with polynomial $G_{32}(z)$ (see Eqn. (2)), computed 32 bits at a time (i.e., M=32) with R8. The matrices A and $A^{-R}$ for this case are given in Eqn. (19), which are illustrated in FIGS. 2A and 2B.

IV. Noted Implementations of the Present Invention

Figure 3:
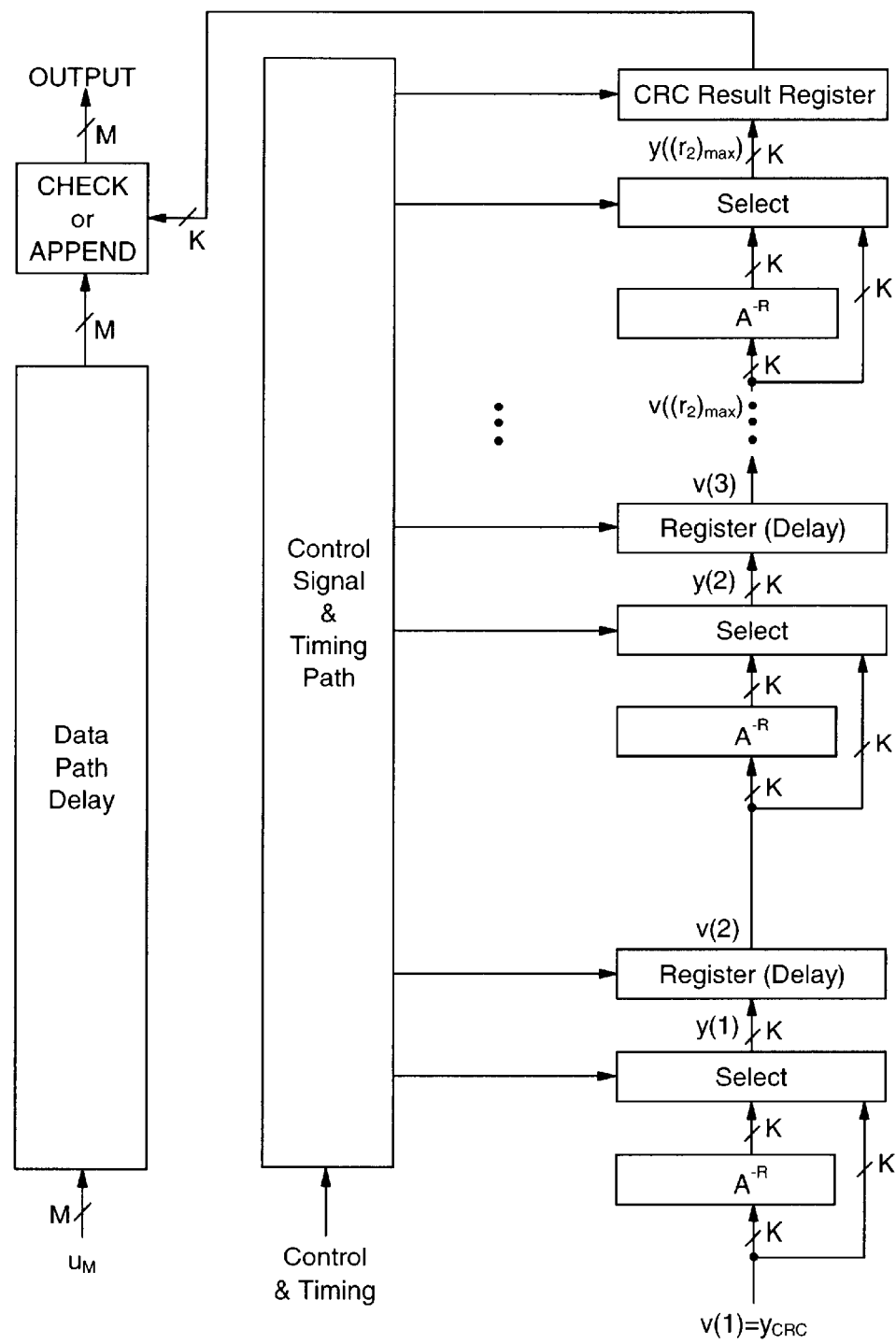
FIG. 3 illustrates an implementation diagram of the postprocessing method.

Our primary interest here is in implementations for which throughput is maximized. We therefore focus on high-performance hardware implementations. We base these on a structure in which the recursion in Eqn. (18) is "unrolled" and pipelined through $(r_2)_{max}$ stages, where $(r_2)_{max}=(M/R)-1$ is the maximum value that $r_2$ can take on. This approach is depicted in FIG. 3.

Referring to the figure, each stage consists of:

(1) A block, labeled $A^{-R}$, that generates the product of this matrix and the block's input, i.e. Eqn. (18). For arithmetic in GF(2), this block could be built as an array of exclusive-or gates (for example, along the lines of the implementation of $A^M$ in [8]). A more efficient implementation based on the method disclosed in the companion patent document is described below.

(2) A block that selects either the input to the stage or the result of the matrix multiplication (i.e. $A^{-R}$ times the input to the stage.

(3) A delay element that latches the output of the "SELECT" block and holds it as either the input to the next stage or, for the last block, the CRC of the input data sequence $u(n)$.

The figure also shows a delay path for the blocked input sequence $u_M$. The purpose of this path is equalize the net delay seen by the input data sequence with the net delay through the entire CRC computation including the postprocessing. This guarantees that the computed CRC is appropriately aligned in time with the last data block, so that it can be appended to the data (for transmission) or checked and the data discarded if necessary (in the receive path). (In fact, it is the one's complement of the CRC that is appended to the data for transmission. It is assumed in the figure that the one's complementing is performed in the block labeled "CHECK or APPEND.") The check or append function would be performed in the block so labeled in the figure. Finally, there is a block that distributes control signals to the "SELECT" blocks as well as clocking to the registers and the data-path delay.

Referring again to FIG. 3, we denote the input to the rth stage by $v(r)$ and the output of its "SELECT" block by $y(r)$, for $r=1,\ldots,(r_2)_{max}$. The rule by which the "SELECT" block operates is $$y(r)=A^{-R}v(r); \; r=1,\ldots,r_2 \quad (19)$$

$$y(r)=v(r); \; r=r_2+1,\ldots,(r_2)_{max}$$

Clearly, if $r_2=0$ then there is no stage for which the first equation in (20) applies, and if $r_2=(r_2)_{max}$ then there is no stage for which the second equation in (20) applies. In addition, we have that $v(1)=y_{CRC}$, while $y((r_2)_{max})$ is equal to the CRC of the input data sequence $u(n)$.

We also have $$v(r)=y(r-1); r=2, \ldots, (r_2)_{max} \qquad (20)$$

implemented through the delay elements. The delay elements provide pipelining, which permits the time effectively occupied by the postprocessing to be minimized. Consider a case in which data frames received from a communication interface are processed through CRC computation circuitry employing the postprocessing shown in FIG. 3. If several short data frames are received back-to-back, this postprocessing method provides the following:

(1) First, the CRC computation of a frame can be overlapped with the postprocessing of the previous frame, because the postprocessing circuitry is separate from the CRC computation circuitry. (Note that in the receive direction there will in general be a serial-to-parallel conversion between the communication interface itself and M-bit-wide register at the input to the CRC computation circuitry. We assume that this operates in such a way that the end of one received data frame and the beginning of the next do not appear in this register at the same time, i.e. that the start of a new data frame is delayed sufficiently so that it is right-adjusted in the input register (using the orientation and notation of Eqn. (12)). The postprocessing technique disclosed here can be modified to work in cases where this assumption does not hold. However, such cases are beyond the scope of the present disclosure because they involve design of the serial-to-parallel conversion, and thus of part of the communication interface itself, as well as design of the CRC computation circuitry.)

(2) Second, because the stages of the postprocessing circuitry are pipelined, the postprocessing of a frame can be overlapped with the postprocessing of the previous frame. The time available for each stage (and thus the clocking of the delay elements) will depend on the number of stages, the minimum length of received data frames, and the minimum idle time between successive received data frames.

Consider again the example above with M=32 and R=8, so that $(r_2)_{max}=3$. Take the minimum data-frame size and minimum interframe period-to be such that when back-to-back minimum-size frames are received, the 32-bit input register at the input to the CRC computation circuitry contains the start a new data frame at every other 32-bit cycle (where the time for one 32-bit cycle of this register is equal to 32 bit-times at the communication interface). In a maximum-throughput design (e.g. using the CRC computation technique disclosed in the companion patent document), the CRC computation for each 32 bits is completed within 32 bit-times, or a single cycle of the 32-bit input register. Thus, when the start of a data frame is ready in the input register, the initial CRC result $y_{CRC}$ for the previous frame is ready for postprocessing; the initial CRC result $y_{CRC}$ for this new frame will be ready for postprocessing two 32-bit cycles (or 64 bit-times) later. (The technique disclosed in the companion patent document itself employs pipelining to achieve "media-speed" CRC computation. To simplify the discussion here, we ignore any pipelining delay through the CRC computation circuitry, i.e., in describing what happens in this example we assume there is no pipelining delay.) For this example, if each stage in the postprocessing pipeline completes within two 32-bit cycles, then the delay elements in FIG. 3 can be clocked at this rate and the postprocessing always keeps up with the received data stream.

Whether or not it is possible for each stage of postprocessing to complete in the time required to keep up with back-to-back minimum-length data frames (two 32-bit cycles, in the example above) depends on many factors. For the maximum-throughput method described in the companion patent document, the maximum possible throughput for CRC computation is $M/t_c$ bits/s, where $t_c$ is the time (in seconds) required to complete two two-input exclusive-or operations and a one-bit register shift; in other words, the time occupied by an M-bit cycle (a 32-bit cycle in the example above) is $t_c$ seconds, with $t_c$ as defined. In the example above, a period of $2t_c$ seconds is available for each stage of postprocessing, consisting of passage through the exclusive-or array that implements the matrix product. $A^{-R}v(r)$ over GF(2), the "SELECT" function, and the register as shown in FIG. 3. In general, it is not possible for all the steps per stage to complete within $2t_c$ seconds. It is possible, however, to break up the exclusive-or array into substages that are themselves pipelined, such that each substage in the overall postprocessing system can complete within $2t_c$ seconds. It is an important advantage of the method disclosed here and its implementation with the recursion of Eqn. (18)"unrolled" as shown in FIG. 3 that this degree of pipelining is possible.

Of course, there may be applications in which a new data frame may begin in every M-bit cycle, so that the time available for each stage (or substage) of the postprocessing pipeline is limited to $t_c$ seconds. While this is possible using the partition into substages just described, the implementation may be complicated because each stage in the unrolled recursion must be partitioned. In fact, by applying the method for CRC computation disclosed in the companion patent document to the postprocessing technique described here (specifically Eqn. (18) or (20)), the desired result can be achieved by simplifying the computation performed at each stage, thereby eliminating the need to partition stages. Two additional computation steps are required, but these are outside the unrolled recursion shown in FIG. 3. Application of this method here will insure that the postprocessing can keep up with the arrival of a new frame in every M-bit interval.

The method in the companion patent document operates by transforming the state vector in Eqns. (13) so that computational complexity in the critical timing path for the transformed equations is minimized. The time required for each iteration of the transformed equations, which processes M bits, is just the time required to complete two two-input exclusive-or operations and a one- bit register shift. A corresponding transformation can be applied to the postprocessing described above, for example to the implementation represented by Eqn. (20). Consider a linear transformation of the vectors $v(r)$ and $y(r)$ through a constant, non-singular matrix T; i.e.

$$v(r)=Tv_t(r); y(r)=Ty_t(r) \qquad (21)$$

where $v_t(r)$ is the transformed version of the vector $v(r)$ and $y_t(r)$ is the transformed version of the vector $y(r)$. Eqns. (20) and (21) are now rewritten as:

$$y_t(r)=A_{Rt}v_t(r); r=1, \ldots, r_2$$

$$y_t(r)=v_t(r); r=r_2+1, \ldots, (r_2)_{max} \qquad (22)$$

$$v_t(r)=y_t(r-1); r=2, \ldots, (r_2)_{max}$$

with $v_t(1)=T^{-1}y_{CRC}$, while $Ty_t((r_2)_{max})$ is equal to the CRC of the input data sequence $u(n)$. The matrix $A_{Rt}$ is $$A_{Rt}=T^{-1}A^{-R}T \qquad (23)$$

Figure 4:
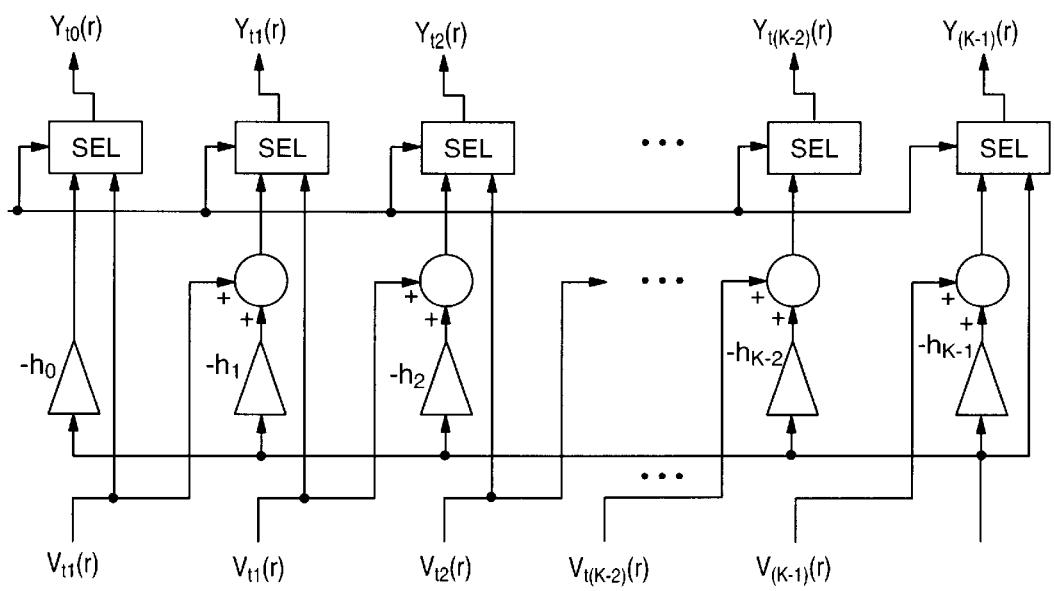
FIG. 4 illustrates an implementation of a transformed per-stage computation.

Using the procedure described in the companion patent document, the matrix T is constructed so that $A_{Rt}$ has the same form as the matrix A in Eqn. (9). We have $$A_{Rt} = \begin{bmatrix} 0 & 0 & \ldots & 0 & 0 & -h_0 \\ 1 & 0 & \ldots & 0 & 0 & -h_1 \\ 0 & 1 & \ldots & 0 & 0 & -h_2 \\ \ldots & \ldots & \ldots & \ldots & \ldots & \ldots \\ 0 & 0 & \ldots & 1 & 0 & -h_{k-2} \\ 0 & 0 & 0 & 0 & 1 & -h_{k-1} \end{bmatrix} \quad (24)$$

where the polynomial H(z) whose coefficients are in the rightmost column of $A_{Rt}$, i.e.

$$H(z) = \sum_{k=0}^{K} h_k z^k \quad (25)$$

is the characteristic polynomial of $A^{-R}$ over GF(2). An implementation of the first two equations in (23) along with the associated "SELECT" function, with $A_{Rt}$ given by Eqn. (25), is shown in FIG. 4, where we use the notation $$v_t(r) = [v_{t0}(r) v_{t1}(r) \ldots v_{t(K-1)}(r)]^T \quad (26)$$

and similarly for $y_t(r)$. Now, recall that for arithmetic in GF(2), the summing elements in the figure are two-input exclusive-or gates, while each gain element is either an open circuit or a short circuit. Given a typical implementation of the gates for the "SEL" blocks, the time required for the computation and selection shown in FIG. 4 will be commensurate with that for two two-input exclusive-or functions. The total time for each stage, including its output register, will be approximately equal to $t_c$. The postprocessing subsystem in FIG. 3 is redrawn in FIG. 5, with the blocks performing multiplication by $A^{-R}$ and the select function in each stage replaced by a block containing what is shown in FIG. 4.

Figure 5:
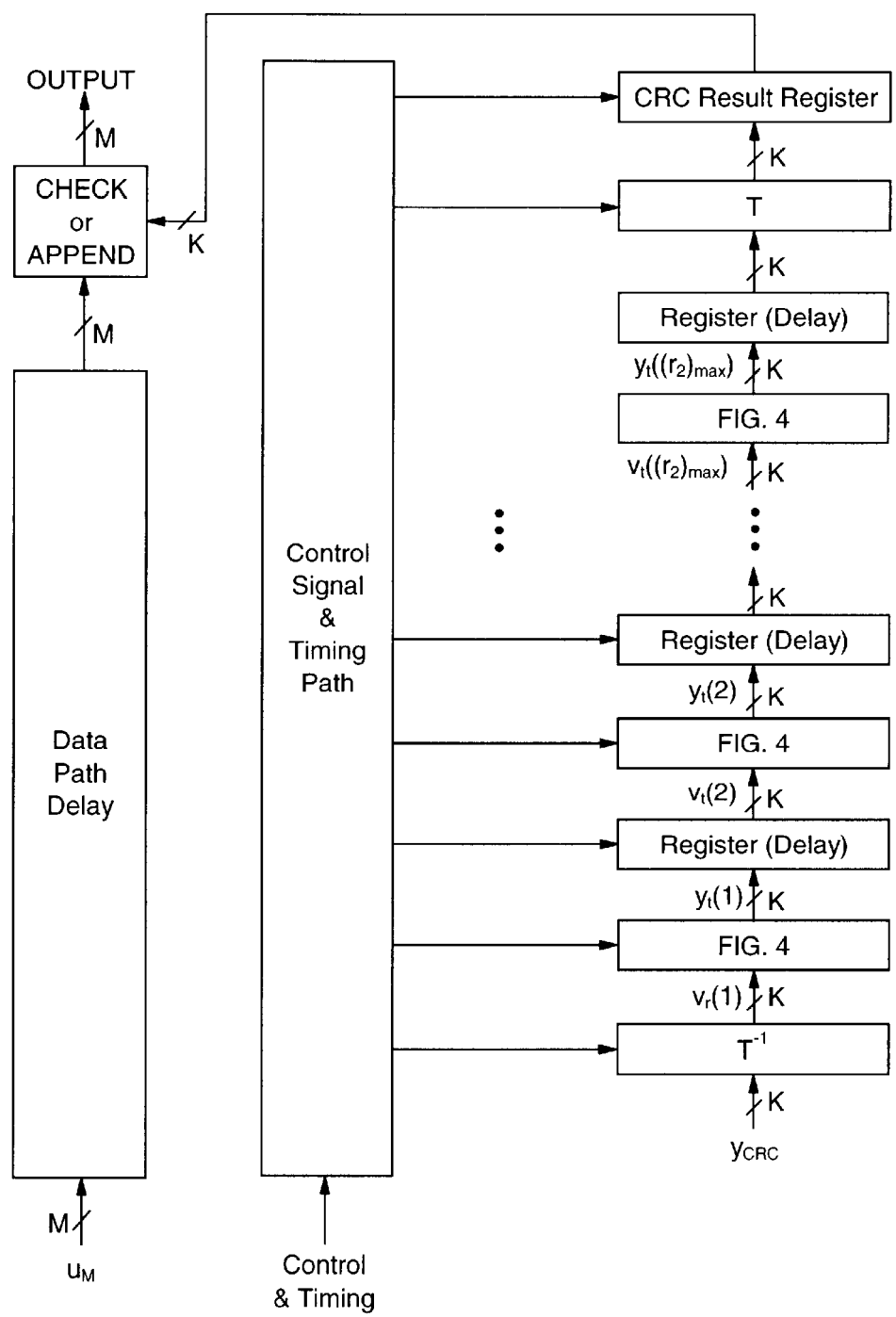
FIG. 5 illustrates an implementation of the postprocessing technique using transformed equations.

Note that FIG. 5 includes the multiplication of $y_{CRC}$ by $T^{-1}$, as well as the multiplication of the output of the last stage by T to obtain the CRC. These products are obtained using exclusive-or arrays. In order to meet the time objective, these arrays must be partitioned and pipelined. One approach to the pipelining of these arrays is described in the companion patent document.

The advantage that the implementation in FIG. 5 has over that in FIG. 3 is that it has the stages of the unrolled recursion reduced to as simple a structure as possible. In return for this simplicity, the matrix multiplications associated with the transformation from $y_{CRC}$ and to $y((r_2)_{max})$ must be added. Whether the implementation in FIG. 5 is superior to that in FIG. 3 will depend on the parameter values (e.g. K, M, R) and other specifics (e.g. minimum data-frame size and interarrival period) for any given application. It is worth noting, however, that if the method in the companion patent document is employed for the CRC computation (i.e. to obtain $y_{CRC}$), then the first transformation shown in FIG. 5 can be combined with a transformation that is the final step of the CRC computation in the companion patent document; in this case, the box labeled $T^{-1}$ at the bottom of FIG. 5 is eliminated, and the implementation in FIG. 5 is almost always superior to that in FIG. 3. For a glimpse at how this works, consider that the method in the companion patent document computes the CRC by applying a l(t transformation to the block state equations (13). We would have $$y_{CRC} = W x_t(m_{max}) \quad (27)$$

where $x_t(m)$ is the transformed state vector for computing the CRC taking M bits at a time, $m_{max}$ is as defined in the text above on page 5, and W is the constant, non-singular matrix defining the transformation. In other words, we can obtain $v_t(1)$ directly from $x_t(m_{max})$ as $$v_t(1) = T^{-1} W x_t(m_{max}) \quad (28)$$

The product $T^{-1}W$ is of course itself a matrix over GF(2), so that the transformation in Eqn. (29) is realizable using a single exclusive-or array. From this point, it is straightforward to draw a block diagram of a complete CRC computation system including postprocessing, based on the methods disclosed here and in the companion patent document.

In fact, in the receive direction, both the box labeled $T^{-1}$ and the box labeled T (that feeds the block marked "CRC RESULT REGISTER) can be eliminated, so that only the shift register blocks illustrated are needed to compensate for zero padding. The reasons are provided in the companion patent document.

Before concluding, it is worthwhile to carry the example described above through the transformation defined in Eqns. (22) through (24) so that $A_{Rt}$ has the form given in Eqn. (25). With the generator polynomial $G_{32}(z)$ and R=8, H(z) is found to be $$H(z) = z^{32} + z^{31} + z^{30} + z^{28} + z^{27} + z^{25} + z^{24} + z^{22} + \\ z^{21} + z^{20} + z^{16} + z^{10} + z^9 + z^6 + 1 \quad (29)$$

and, using the procedure described in the companion patent document, we obtain for T and $T^{-1}$, respectively, the matrices provided in FIGS. 6A and 6B.

V. Noted Applications of the Present Invention

The method disclosed here is most interesting in the context of high-speed communication interfaces, where hardware solutions for parallel CRC computation are employed to maximize throughput. As a consequence, we focused on hardware implementations of the postprocessing method. As discussed above, the preferred embodiment would employ the technique disclosed in the companion patent document to implement the postprocessing method, with this technique also employed to implement the parallel CRC computation itself.

It should be noted that software implementations of the postprocessing method are possible. These might involve using tables to perform the "backward" computation in Eqn. (18) following an approach similar to that in (6) that employs tables in a software implementation of the computation in Eqns. (13).

While the invention has been particularly shown and described with reference to preferred embodiments thereof, it will be understood by those skilled in the relevant art that various changes in form and details may be made therein without departing from the spirit and scope of the invention.

What is claimed is:

1. A method for computing a cyclic redundancy code (CRC) for use in a communication data stream M bits at a time for an input sequence u(n) whose length is not a multiple of M, comprising:
   (i) representing a frame of data to be protected as the input sequence;
   (ii) determining a CRC for said input sequence M bits at a time from a state vector, until a last block of said input sequence is reached;

(iii) if said last block of said input sequence is full, then determining said CRC to be a completed CRC; and (iv) if said last block of said input sequence is not full, then:

(a) setting a number of the last bits of said last block equal to zero;

(b) processing said last block, padded with said number of last bits equal to zero, according to steps (i) and (ii) to determine a new CRC ($y_{CRC}$); and (c) running said state vector backwards in time to determine a completed CRC.

2. The method according to claim 1, further comprising:

(v) appending said completed CRC as a frame check sequence (FCS) to said communication data stream for detection by a receiving device.

3. The method according to claim 1, input sequence u(n) is defined in the field of integers modulo 2 (GF(2)).

4. The method according to claim 1, wherein step (i) further comprises:

grouping the elements of said input sequence into blocks of length M; and representing said input sequences in a block oriented fashion as $$u_M(m_{max}) = [u(mM+M-1)u(mM+M-2) \ldots u(mM+1)u(mM)]^T,$$

wherein m=0, 1, ..., $m_{max}$, wherein $m_{max}$ equals (N/M)−1.

5. The method according to claim 1, wherein said state vector is represented by $$x(m+1) = A^M x(m) + B_M u_M(m),$$

wherein m is an integer, wherein A is a K×K matrix containing the coefficients of a CRC generator polynomial, wherein x(m) is a K dimensional state vector defined as $[x_0(m)\ x_1(m) \ldots x_{K-1}(m)]^T$, wherein $B_M$ is a K×M matrix whose columns are determined by multiplying b by successively higher powers of A, and wherein b is a K dimensional vector containing one or more coefficients of a CRC generator polynomial.

6. The method according to claim 5, wherein said last block is represented as $u_M(m_{max})$, and wherein whether said input sequence is full is found by determining whether a quantity N/M is an integer and a quantity $r_2=0$, wherein N is the length of said input sequence, wherein R is the greatest common divisor of M, and wherein the last ($r_2$)(R) bits of the last block $u_M(m_{max})$ are zeros.

7. The method according to claim 5, wherein step (iv)(a) comprises setting ($r_2$)(R) bits of said last block equal to zero.

8. The method according to claim 5, wherein said new CRC ($y_{CRC}$) contains the CRC of the input data sequence augmented with $r_2 R$ zeros at its end, wherein R is the greatest common divisor of M, and wherein $r_2$ is defined by the fact that the last ($r_2$)(R) bits of the last block are zeros.

9. The method according to claim 5, wherein step (iv)(c) comprises executing $$x'(r-1) = A^{-R} x'(r)$$

for $r_2$ iterations, until $x'(r-1) = x'(N/R)$, which equals said completed CRC, wherein R is the greatest common divisor of M, and wherein $r_2$ is defined by the fact that the last ($r_2$)(R) bits of the last block are zeros, wherein r is initially defined as ($r_2+(N/R)$), and wherein $x'(r_2+(N/R))$ equals said new CRC ($y_{CRC}$).

10. A system for computing a cyclic redundancy code (CRC) for use in a communication data stream M bits at a time for an input sequence u(n) whose length is not a multiple of M, comprising:

device that represents a frame of data to be protected as the input sequence;

device that determines a CRC for said input sequence M bits at a time from a state vector, until a last block of said input sequence is reached;

device that determines said CRC to be a completed CRC if said last block of said input sequence is full; and CRC completing device that sets a number of the last bits of said last block equal to zero;

processes said last block, using said frame representing device and said CRC determining device, padded with said number of last bits equal to zero, to determine a new CRC ($y_{CRC}$); and runs said state vector backwards in time to determine a completed CRC, if said last block of said input sequence is not full.

11. The system according to claim 10, further comprising:

device that appends said completed CRC as a frame check sequence (FCS) to said communication data stream for detection by a receiving device.

12. The system according to claim 10, input sequence u(n) is defined in the field of integers modulo 2 (GF(2)).

13. The system according to claim 10, wherein step (i) further comprises:

device that groups the elements of said input sequence into blocks of length M; and device that represents said input sequences in a block oriented fashion as $$u_M(m_{max}) = [u(mM+M-1)u(mM+M-2) \ldots u(mM+1)u(mM)]^T,$$

wherein m=0, 1, ..., $m_{max}$, wherein $m_{max}$ equals (N/M)−1.

14. The system according to claim 10, wherein said state vector is represented by $$x(m+1) = A^m x(m) + B_M u_M(m),$$

wherein in is an integer, wherein A is a K×K matrix containing the coefficients of a CRC generator polynomial, wherein x(m) is a K dimensional state vector defined as $[x_0(m)\ x_1(m) \ldots x_{K-1}(m)]^T$, wherein $B_M$ is a K×M matrix whose columns are determined by multiplying b by successively higher powers of A, and wherein b is a K dimensional vector containing one or more coefficients of a CRC generator polynomial.

15. The system according to claim 14, wherein said last block is represented as $u_M(m_{max})$, and wherein whether said input sequence is full is found by determining whether a quantity N/M is an integer and a quantity $r_2=0$, wherein N is the length of said input sequence, wherein R is the greatest common divisor of M, and wherein the last ($r_2$)(R) bits of the last block $u_M(m_{max})$ are zeros.

16. The system according to claim 14, wherein said CRC completing device comprises:

device that sets $(r_2)(R)$ bits of said last block equal to zero.

17. The system according to claim 14, wherein said new CRC ($y_{CRC}$) contains the CRC of the input data sequence augmented with $r_2R$ zeros at its end, wherein R is the greatest common divisor of M, and wherein $r_2$ is defined by the fact that the last $(r_2)(R)$ bits of the last block are zeros.

18. The system according to claim 14, wherein said CRC completing device comprises:

means that executes $$x'(r-1) = A^{-R} x'(r)$$

for $r_2$ iterations, until $x'(r-1)$ equals $x'(N/R)$, which in turn equals said completed CRC, wherein R is the greatest common divisor of M, and wherein $r_2$ is defined by the fact that the last $(r_2)(R)$ bits of the last block are zeros, wherein r is initially defined as $(r_2+(N/R))$, and wherein $x'(r_2+(N/R))$ equals said new CRC ($y_{CRC}$).

19. A method for detecting an error in a communication data stream, comprising:

(i) representing a frame of data to be protected as an input sequence u(n) over GF(2) (field of integers modulo 2);

(ii) determining a cyclic redundancy code (CRC) for said input sequence from the equation:

$$CRC = (A^{-R})^{r_2} x(m_{max}+1),$$

wherein $x(m_{max}+1)$ is defined as $A^M x(m_{max}) + B_M u_M(m_{max})$, wherein $u_M(m_{max})$ is defined as $[u(mM+M-1) \; u(mM+M-2) \ldots u(mM+1) \; u(mM)]^T$, wherein m=0, 1, ..., (N/M) −1, wherein N is the length of said input sequence, wherein M is the length of a block of said input sequence, wherein said input sequence is grouped into blocks, wherein b(n) is a K dimensional vector containing one or more coefficients of a CRC generator polynomial, wherein $B_M$ is a K×M matrix whose columns are determined by multiplying b(n) by successively higher powers of A, wherein A is a K×K matrix containing the coefficients of said CRC generator polynomial, wherein $x(m_{max})$ is a K dimensional state vector defined as $[x_0(m_{max}) \; x_1(m_{max}) \ldots x_{K-1}(m_{max})]^T$, wherein $m_{max}$ is the smallest integer greater than or equal to ((N/M−1), wherein K is the degree of said CRC generator polynomial, wherein R is the greatest common divisor of M, wherein $(r1+r_2)R$ equals M, and wherein the last $(r_2)(R)$ bits of the last block $u_M(m_{max})$ are zeros, (iii) appending said CRC as a frame check sequence (FCS) to said communication data stream for detection by a receiving device.

* * * * *